United States Patent [19]

Schumacher

[11] 4,140,735
[45] Feb. 20, 1979

[54] PROCESS AND APPARATUS FOR BUBBLING GAS THROUGH A HIGH PURITY LIQUID

[75] Inventor: John C. Schumacher, Oceanside, Calif.

[73] Assignee: J. C. Schumacher Co., Oceanside, Calif.

[21] Appl. No.: 824,375

[22] Filed: Aug. 15, 1977

[51] Int. Cl.² .............................................. B01F 3/04
[52] U.S. Cl. .................................. 261/22; 137/68 R; 261/124; 261/125; 261/DIG. 65; 285/3
[58] Field of Search .................................... 261/20–22, 261/121 R, 122–125, DIG. 65; 285/3, 9 M; 137/68 R

[56] References Cited

U.S. PATENT DOCUMENTS

| | | | |
|---|---|---|---|
| 1,594,947 | 8/1926 | Hartman et al. | 261/125 X |
| 3,053,413 | 9/1962 | Fever | 137/68 R X |
| 3,319,400 | 5/1967 | Wilson et al. | 261/22 X |
| 3,572,660 | 3/1971 | Mahon et al. | 261/DIG. 65 |
| 3,744,771 | 7/1973 | Deaton | 261/DIG. 65 |
| 3,793,810 | 2/1974 | McPhee | 261/DIG. 65 |
| 3,834,682 | 9/1974 | McPhee | 261/DIG. 65 |
| 4,045,525 | 8/1977 | Huggins | 261/DIG. 65 |
| 4,051,886 | 10/1977 | Ross | 261/DIG. 65 |

*Primary Examiner*—Richard L. Chiesa
*Attorney, Agent, or Firm*—Knobbe, Martens, Olson, Hubbard & Bear

[57] ABSTRACT

A bubbler system utilizing interconnected dual-chambers forming a series path for a carrier gas thereby rendering useful in excess of 90 percent of the material contained therein. The inlet and outlet ports of the bubbler system are provided with an inner and outer seal, creating a compartment in which may be positioned a small hammer. The user of the system removes the outer seals, makes desired connections to the ports, and thereby connects the bubbler to a using system without exposing the material to the atmosphere.

13 Claims, 3 Drawing Figures

U.S. Patent      Feb. 20, 1979      4,140,735
FIG. 1.
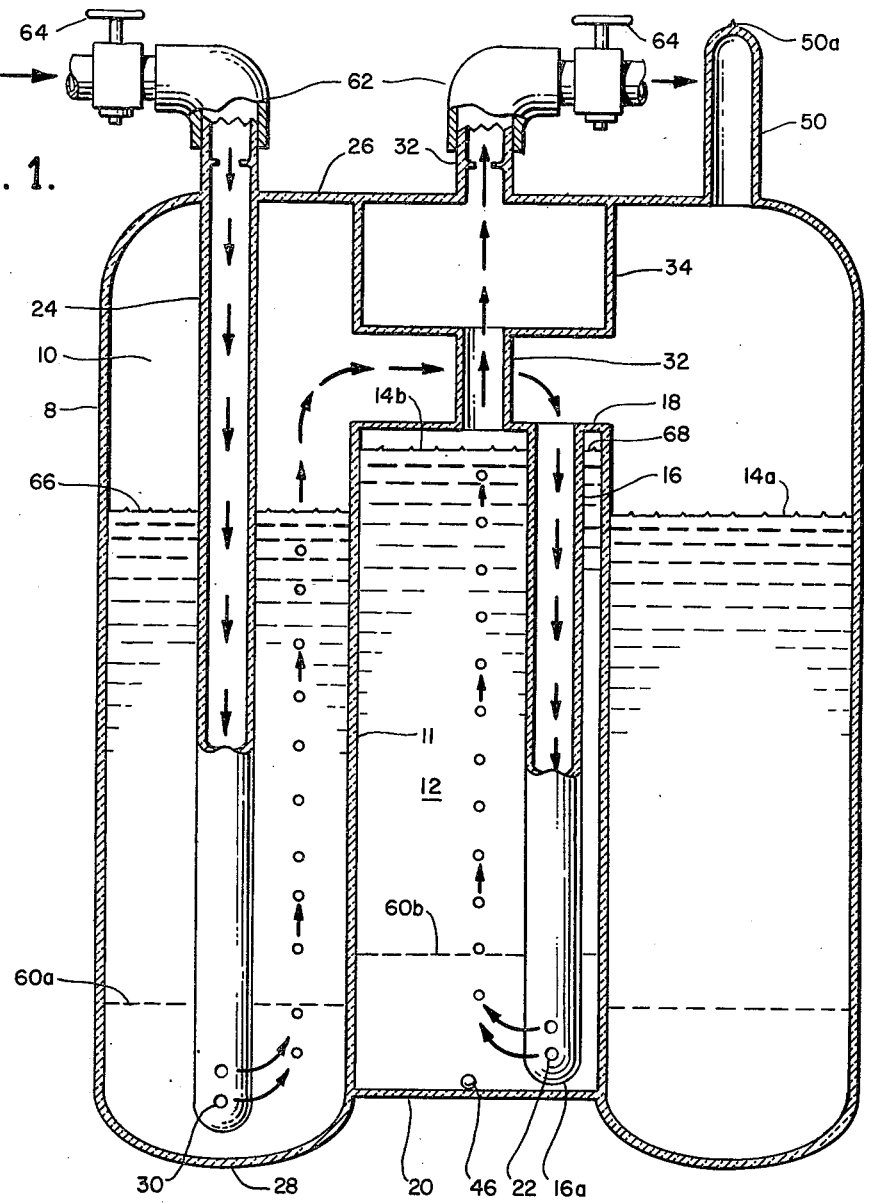
FIG. 2.
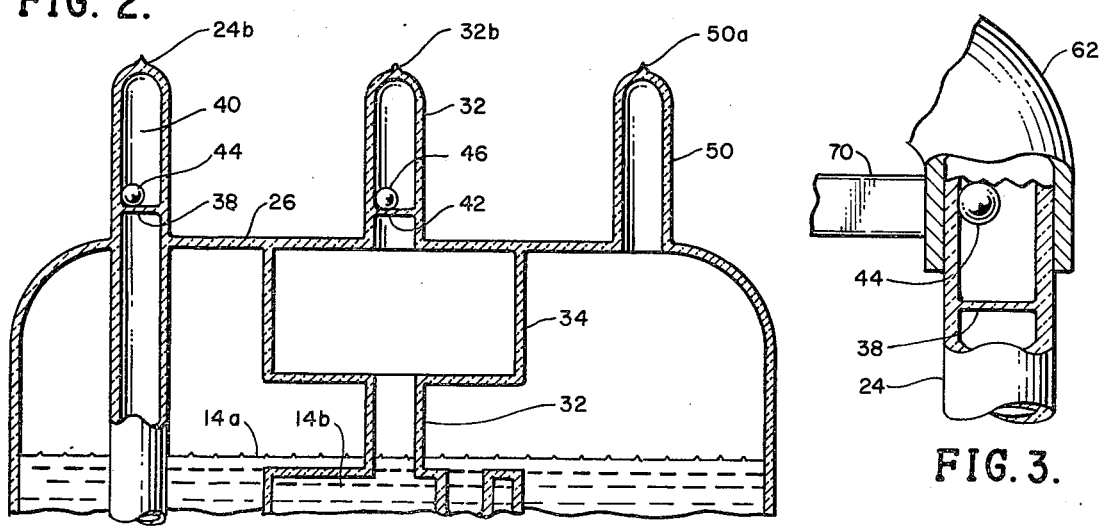
FIG. 3.

PROCESS AND APPARATUS FOR BUBBLING GAS THROUGH A HIGH PURITY LIQUID

RELATED APPLICATION

This application is related to U.S. patent application, Ser. No. 746,923, filed Dec. 12, 1976 entitled Liquid Source Material Container and Method of Use for Semiconductor Device Manufacturing.

BACKGROUND OF THE INVENTION

This invention relates to an improved bubbler system for rendering useful most of the liquid in a bubbler, and is particularly advantageous in connection with high purity liquid source materials used in the manufacturing of semiconductor devices.

In the manufacturing of semiconductor devices, a gas stream, saturated with an active compound is entered into a diffusion or chemical vapor deposition furnace. The active compound called a liquid source material contains an element which is diffused into or deposited upon a suitable substrate within the furnace. For example, boron tribromide can serve as a liquid source material for diffusion of boron into silicon or to deposit a borosilicate glass or boron itself, upon a suitable substrate. Typically, other liquid source materials used in semiconductor manufacturing include phosphorous oxychloride, phosphorous tribromide, silicon tetrabromide, arsenic trichloride, arsenic tribromide, and antimony pentachloride.

Since these materials readily react with air and to varying degrees, pose a health hazard to workers exposed to them, they require minimum or zero exposure to the atmosphere. Such nonexposure to the atmosphere is also required from a process control standpoint, since production yield is dependent upon the purity of the liquid source materials.

The function of a bubbler system in semiconductor manufacturing is to present a high-purity gas stream saturated with an active compound to the diffusion or chemical vapor deposition furnace. It is highly desirable in relation to process control for the bubbler to deliver a constant amount of active compound per unit time to the using furnace. This constant delivery is accomplished by insuring complete saturation of the carrier gas with the liquid source material.

The saturation condition at a given temperature, may be defined as the state obtained when the partial pressure of the solute (the active compound) in a gaseous solution is equal to the vapor pressure of the pure solute at that given temperature. Therefore, saturation defines a maximum amount of solute which can be contained in the gaseous solution at equalibrium. Saturation is achieved by bubbling the carrier gas through the liquid source material to promote liquid-vapor interaction and transport of the liquid into the vapor. Obviously, saturation will be dependent upon many variables such as the gas bubble size, the path length for the gas bubbles through the liquid source material, and the residence time of the bubbles in the source material.

Presently, standard bubblers used in the semiconductor industry utilize a single chamber filled with liquid source material into which an inert carrier gas such as nitrogen or argon is circulated. For a given gas volume and bubble size, a certain minimum path length must be maintained in order to achieve complete saturation. Typically, this minimum path length is a distance of 1-1½ inches of passage through the source material. Therefore, when the level of liquid source material falls below this minimum path length, saturation is no longer obtained and process control problems result.

Since various problems of contamination of the source material, discrepancies in source material lots, and health concerns are present in adding new source material to the bubbler, usual procedure is to discard the source material remaining in the bubbler and install a clean bubbler with a fresh charge, when the liquid level is below the minimum path length.

Due to this procedure of discarding the liquid source material after the minimum path length is lost, typically only 60 to 65 percent of the source material is utilized. Such source material waste, necessarily adds substantially to the cost of semiconductor devices.

SUMMARY OF THE INVENTION

In accordance with the present invention, an improved bubbler system is disclosed which decreases health hazards, prevents contamination and renders useful a high percentage of the liquid source material contained therein. This is accomplished by using a dual-chambered, interconnected bubbler system which presents a series path for the carrier gas. Ideally, this bubbler system is constructed of quartz and is filled at the factory, although it may be constructed of other materials such as pyrex, or stainless steel and may be filled by the user if desired.

More specifically, in the preferred construction, the new bubbler system utilizes a sealed outer chamber which encapsulates a sealed inner chamber; such chambers containing their own volume of liquid source material. The chambers are interconnected in a manner to present a series path to carrier gas flowing through, and yet avoid liquid level communication and equilibration. The carrier gas is saturated in the outer chamber until such time as the level of the liquid source material contained in the outer chamber falls below the minimum path length. During this time interval, the liquid level in the inner chamber remains constant, since the carrier gas being saturated in the outer chamber, is incapable of transporting any further amounts of source material. Even after this point, the majority of saturation continues to occur in the outer chamber due to some bubbling as well as surface interaction caused by the carrier gas flowing across the surface of the liquid source material. The carrier gas then enters the inner chamber in which the gas stream is "topped off" or completely saturated by bubbling through the source material contained therein. The bubbler system is used until the liquid level in the inner chamber falls below the minimum path length. By proper design this bubbler system can limit the waste of the liquid source material to 2 to 5 percent.

Additionally, ths bubbler system is provided with a double seal arrangment as disclosed in the above-mentioned earlier application to prevent atmospheric contamination of the liquid source material contained therein. This sealing arrangement comprises a thin, breakable wall formed across the inlet and outlet ports near the point where the ports enter the outer chamber. The outer ends of these ports are then closed by flame sealing or another suitable manner. In the void or space created between these two seals, a quartz enclosed metallic hammer is positioned above the thin wall seal.

To use the bubbler system, the external flame seals are removed and the bubbler is connected to the using system. Then, the space in the inlet and outlet ports are purged of any air or moisture that has accumulated since removal of the outer seals by use of a dry inert gas. The breakable seals then may be broken by appropriate external means and the bubbler system can be used.

These and other features of the present invention are best understood through reference to the drawings in which:

FIG. 1 is a cross-sectional view showing the bubbler system in operation;

FIG. 2 is a cross-sectional view of the bubbler system showing the inner and outer seals of the inlet and outlet tubes before they have been broken; and FIG. 3 is an enlarged cross-sectional view of one of the tubes illustrating the manner in which the inner seal is broken.

DETAILED DESCRIPTION OF THE PREFERRED EMBODIMENT

Referring to FIG. 1, there is shown the bubbler of this invention which includes a generally cylindrical side wall 8, a top wall 26 and a bottom wall 28 forming the sealed outer chamber 10. Sealed within this chamber 10 is an appropriately positioned inner chamber 12 defined by a cylindrical wall 11, a top wall 18 and a bottom wall 20 preferably formed integral with wall 28. Both chambers contain a volume of liquid source material 14a and 14b. The two chambers 10 and 12 are interconnected by an elongate tube 16 extending through and secured to the upper wall 18 or side wall 11 of the inner chamber. The lower end 16a of the tube 16 terminates near the bottom wall 20 of the inner chamber and has one or more openings 22 in its lower end.

An inlet tube 24 extends through the upper wall 26 of the outer chamber 10 and terminates near the bottom wall 28 of the outer chamber. As with the elongate tube 16, there is provided one or more openings 30 in the lower end of the inlet tube 24.

An outlet tube 32 is attached to the upper wall 18 of the inner chamber and passes through the upper wall 26 of the outer chamber. The outlet tube 32 forms an enlarged section 34 inside the outer chamber 10, which serves as an overflow reservoir for the inner chamber.

The bottom wall 28 of the outer chamber extends below the bottom wall 20 of the inner chamber and is formed in a concave configuration. By such design, the volume of liquid material necessary to produce the minimum path length can be reduced, thereby increasing saturation in the outer chamber and decreasing liquid material waste.

Portions of the inlet and outlet tubes 24 and 32 respectively, extend above the upper chamber wall 26 and are initially closed by flame sealing at 24b and 32b, as seen in FIG. 2. A thin internal wall 38 extends across the inlet tube 24 at a point adjacent or slightly above the upper wall 26 of the outer chamber and is spaced from the upper end 24b to form a small compartment 40. The internal wall 38 thereby forms an internal second seal blocking entry to the outer chamber. Shown positioned on the wall 38 is a small hammer 44 consisting of a small piece of magnetically attracted metal encased in an inert material such as quartz. Similarly, the outlet tube 32 is constructed with a flame sealed end 32b, a thin inner wall 42 and a quartz enclosed hammer 46.

An auxiliary tube 50 used for filling the bubbler, is attached to the upper wall 26 of the outer chamber 10 with the upper end of the tube 50a being flame sealed after the filling operation. The bubbler is filled to a level above upper wall 18 or side wall 11 opening of the inner chamber 12 so that the inner chamber is completely filled by way of the tube 16. Since both chambers are filled in one operation, variances in the liquid material contained in each chamber is eliminated.

For use, the bubbler must be connected to the using system (described infra). First, the upper flame sealed ends 24b and 32b of the inlet and outlet tubes are removed. Pipe and valving connections 62 and 64 are connected to the opened ends of the inlet and outlet tubes 24 and 32 and are bathed in an inert gas to remove any accumulated moisture. A magnet 70 is then used to externally raise the hammer 44, as shown in FIG. 3. Upon removing the magnet, the hammer falls breaking the thin wall 38. The thin wall 42 in the outlet tube 32 is then broken in similar fashion. By such a procedure, the bubbler system can be connected to a using system without any contamination of the source material, or without any exposure to personnel.

After connecting the bubbler to the using system, a carrier gas, typically nitrogen or argon, is applied to the bubbler through the inlet tube 24. The carrier gas emerges from the lower end of the inlet tube 24 at the openings 30 and bubbles upwardly through the liquid source material 14a contained in the outer chamber, becoming saturated. As shown in FIG. 1, the bottom wall 28 of the outer chamber is concave and extends below the bottom wall 20 of the inner chamber. This concave design serves to decrease the volume of liquid required to achieve the minimum path length for gas saturation. The pressure of the incoming carrier gas forces the gas to enter the inner chamber 12 through the interconnecting elongate tube 16. The gas then emerges through the openings 22 in the elongate tube and bubbles up through the liquid source material contained in the inner chamber. The saturated gas then exits the bubbler through the outlet tube 32 to be utilized in the manufacturing process of semiconductor devices.

When high flow rates of carrier gas are used in the bubbler system, some displacement of the liquid source material contained in the chambers may occur. This displacement is facilitated by the enlarged section 34 of the outlet tube 32. During the initial use of the bubbler when displacement is encountered, the enlarged section 34, serves as an overflow reservoir and prevents any source material from exiting the bubbler in a liquid state. After prolonged use, the reservoir allows the source material to descend back into the inner chamber 12.

It can be understood that during the initial usage period of the bubbler, saturation of the carrier gas is achieved in the outer chamber since the liquid level 66 of the source material is greater than the minimum path length required to insure saturation, 60a. Therefore, during this period the liquid level 68 of the inner chamber remains constant. However, when the source material is depleted below this minimum path length 60a in the outer chamber, the carrier gas is then "topped off" in the inner chamber. Complete saturation will be insured until the fluid level in the inner chamber falls below the level 60b which is required to provide the minimum path length. At that level, only about 2 to 5 percent of the liquid remains, depending on the exact design details of the container.

What is claimed is:

1. A bubbler system for bubbling a carrier gas through a high purity liquid which is not to be exposed to the atmosphere, in a manner to maximize utilization of the liquid comprising:

a closed outer chamber;

an inner chamber positioned within said outer chamber;

an inlet tube entering near the upper portion and extending into said outer chamber, terminating near the lower end of said chamber and having one or more openings in the lower end of said inlet tube;

an outlet tube attached at one end to the upper portion of said inner chamber and passing through said outer chamber at the other end, said outlet tube additionally having an enlarged section lying between said ends of said outlet tube and positioned within said outer chamber;

a tubular member forming a series path between said chambers, said member being open on its upper end and extending through a wall of the inner chamber upper portion into said inner chamber, terminating near the lower end of said inner chamber and having one or more openings in the lower end of said tubular member;

a thin breakable wall extending across said inlet and outlet tubes positioned adjacent to or above the upper wall of said outer chamber, said thin walls forming an inner seal to said chambers; and a wall extending across said inlet and outlet tubes positioned above said thin walls, forming a second seal to said chambers.

2. A method for bubbling a carrier gas through a liquid to saturate the gas in a manner to maximize utilization of the liquid comprising the steps of:

ducting a dry inert carrier gas into the lower end of a large chamber in a container by way of an inlet tube extending through an upper wall of said chamber and terminating near the lower wall of said chamber, said container having a batch of high purity liquid therein and said container being sealed except for a gas inlet and outlet so that the liquid is not exposed to external air or otherwise contaminated;

bubbling said carrier gas upwardly through a quantity of said liquid in said chamber and transporting the liquid in vapor form out of said chamber, the initial depth of said liquid being substantially greater than that sufficient to saturate the gas as it is bubbled upwardly through the chamber the depth of said liquid decreasing as the gas becomes saturated in that the supply of liquid is not replenished as the vapor is carried away;

channeling said carrier gas from the upper end of said chamber into the lower end of a smaller, contiguous chamber by way of a connecting tube open to the upper end of said large chamber and extending through a wall of said smaller chamber and terminating in the lower end of said smaller chamber, said chambers being sealed from each other except by said connecting tube, said smaller chamber containing a quantity of said liquid;

bubbling said carrier gas upwardly through the liquid in said smaller chamber and completing the saturation of said gas after the depth of the liquid in said large chamber is insufficient to saturate the gas, the initial depth of the liquid in said smaller chamber being substantially greater than that sufficient to saturate the gas as it is bubbled through the smaller chamber even if there were no liquid in the large chamber;

exiting said carrier gas out of the upper end of said smaller chamber to a system using the vaporized liquid; and discontinuing the flow of said carrier gas before the total length of the path travelled by the gas through said liquid in both chambers drops below a predetermined minimum required to saturate the gas.

3. A method of transporting a high purity liquid by saturating a carrier gas comprising the steps of:

acquiring said liquid in a dual chambered bubbler container with one chamber being larger than the other and each of the chambers having been filled in the same operation with a substantial quantity of said liquid, said container having an inlet and an outlet tube, with spaced inner and outer walls extending across said inlet and outlet tubes to form a double seal;

breaking said outer seal walls of said inlet and outlet tubes;

applying an inert gas to the open ends of said tubes;

connecting said inlet tube to a carrier gas source and connecting said outlet tube to a using system;

breaking said inner seals by external means;

applying a carrier gas into the lower end of the larger one of said dual chambers;

bubbling said carrier gas through said liquid contained in said larger chamber;

channeling said carrier gas from the upper end of said larger chamber into the lower end of the smaller of said dual chambers;

bubbling said carrier gas through said liquid contained in said smaller chamber; and exiting said carrier gas out of the upper end of said smaller chamber to the using system.

4. A method of saturating a carrier gas with liquid comprising:

filling a first and second chamber of a dual chambered bubbler system with a high purity liquid, said chambers being contiguous, but interconnected by a tube open to the top of the first chamber and extending into the lower end of said second chamber in a manner such that when filling one of said chambers, the other of said chambers is also filled;

sealing the container;

transporting the container to a using location;

breaking a seal on an inlet tube connected to the first chamber and extending into the lower end of said first chamber;

connecting said inlet tube to a source of carrier gas and applying the carrier gas into the lower end of said first chamber;

bubbling said carrier gas up through said liquid contained in said first chamber;

channeling said carrier gas through said tube from said first chamber into the lower end of said second chamber;

bubbling said carrier gas upward through said liquid in said second chamber; and exiting said carrier gas out of the upper end of said second chamber.

5. A container for shipping, storing and using a quantity of liquid in a manner to maintain the purity of the liquid and to maximize utilization of the liquid, comprising:

means defining a closed outer chamber including an imperforate bottom wall, side walls, and an upper wall;

means defining an inner chamber positioned within said outer chamber including an imperforate bottom wall, side walls, and an upper wall;

tube means open to the interior upper end of said outer chamber and extending through a wall of said inner chamber terminating in the lower end of the inner chamber, said chambers being interconnected by way of said tube means and being otherwise sealed from each other so that communication between the two chambers must be through said tube means, and so that when one chamber is filled with liquid through a connection to the container, the other may be filled through said tube means;

a gas inlet tube extending through a wall of the upper portion of said outer chamber into said outer chamber and terminating near the lower end of said outer chamber, said inlet tube being sealed closed on its upper end during shipment and storage of the container but being openable for connection to a supply of a carrier gas, said tube having an opening in its lower end so that the tube may serve as an inlet for a carrier gas to be applied to said outer chamber and bubbled upwardly through the liquid in the outer chamber; and outlet means connected to the upper portion of the inner chamber and opening to the exterior of the container to form an outlet for the carrier gas after it is serially bubbled through liquid in said chambers, the upper end of said outlet means being closed during shipment and storage but being openable for connection to a using source of the liquid carried by said gas out of the container.

6. The container of claim 5 wherein said outer chamber is annularly shaped and surrounds said inner chamber so that the side walls of the inner chamber form the inner wall of the outer chamber.

7. The container of claim 5 wherein the open upper end of said tube means is formed integral with the upper wall of said inner chamber so that when the container is filled with liquid through a temporary connection to the outer chamber, the inner chamber is filled through the open upper end of said tube means when the level of liquid in the outer chamber reaches the open upper end of said tube means.

8. The container of claim 5 wherein said inner chamber is substantially smaller in volume than said outer chamber but the depth of said chambers is substantially greater than the minimum path length through which the carrier gas must pass through said liquid to become saturated, thereby insuring utilization of a high percentage of the liquid in the container.

9. The system of claim 5 wherein said outlet means comprises:
a tubular member attached at one end to the upper portion of said inner chamber and passing through said outer chamber at the other end, said tubular member additionally comprising an enlarged section lying between said ends of said tubular member and positioned within said outer chamber, said enlarged section serving as an overflow liquid reservoir for said inner chamber when gas is applied to said inlet means.

10. The system of claim 5 wherein said outer and inner chambers contain a liquid material through which said gas must pass in reaching said outlet means, said gas becoming saturated and transporting liquid material through said outlet means as a vapor.

11. The system of claim 5 wherein the bottom wall of said inner chamber is integral with the bottom wall of said outer chamber, and the upper wall of said inner chamber is lower than the upper wall of said outer chamber.

12. The bubbler system of claim 5 additionally comprising:
readily breakable wall means extending across said inlet tube and said outlet means forming inner seals to prevent access to said chambers; and
means extending across said inlet tube and said outlet means spaced outwardly from said inner seals forming outer seals to prevent access to said inner seals.

13. The bubbler system of claim 12 including a small hammer positioned on said wall means forming said inner seal, said hammer being made of a material which is magnetically movable, and which is completely sealed in inert material.

* * * * *